(12) United States Patent
Imai

(10) Patent No.: US 10,771,060 B2
(45) Date of Patent: Sep. 8, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hitoshi Imai, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/530,464

(22) Filed: Aug. 2, 2019

(65) Prior Publication Data
US 2020/0220541 A1   Jul. 9, 2020

(30) Foreign Application Priority Data

Jan. 9, 2019   (JP) .................................. 2019-001960

(51) Int. Cl.
*H03K 17/78* (2006.01)
(52) U.S. Cl.
CPC .................................. *H03K 17/78* (2013.01)
(58) Field of Classification Search
CPC .................................................. H03K 17/78
See application file for complete search history.

(56) References Cited

U.S. PATENT DOCUMENTS

| 7,209,172 | B2* | 4/2007 | Jelley ..................... H04N 3/155 348/308 |
| 7,474,345 | B2* | 1/2009 | Luo ........................ H04N 5/335 348/297 |
| 7,652,508 | B2* | 1/2010 | Maeda ................. G09G 3/3406 327/72 |
| 2007/0035801 | A1 | 2/2007 | Higashiyama et al. |

FOREIGN PATENT DOCUMENTS

| JP | S63-110676 A |   | 5/1988 |
| JP | 406141128 | * | 5/1994 |
| JP | 2002-171159 |   | 6/2002 |
| JP | 2007-26486 A |   | 2/2007 |

* cited by examiner

*Primary Examiner* — Dinh T Le
(74) *Attorney, Agent, or Firm* — White & Case LLP

(57) ABSTRACT

A semiconductor device includes a transmission circuitry, a reception circuitry, a comparison circuitry, a timer circuitry, and a switch circuitry. The transmission circuitry converts a first signal based on an input signal into a second signal and transmits the second signal. The reception circuitry is electrically insulated from the transmission circuitry, receives the second signal, and outputs a third signal. The comparison circuitry compares a reference voltage and a comparison object signal being one of the input signal and the third signal, and outputs a fourth signal. The timer circuitry outputs, when the fourth signal shifts, a fifth signal based on timing of the shift. The switch circuitry switches and outputs the reference voltage, based on the fifth signal.

10 Claims, 5 Drawing Sheets

SEMICONDUCTOR DEVICE

CROSS REFERENCE TO RELATED APPLICATIONS

This application is based upon and claims the benefit of priority from the prior Japanese Patent Application No. 2019-001960, filed on Jan. 9, 2019, the entire contents of which are incorporated herein by reference.

FIELD

The embodiments of the present invention relate to semiconductor device.

BACKGROUND

A photocoupler is a device achieving both electrical insulation and signal transmission and is widely applied in various fields. In particular, a photocoupler for high-speed digital signal transmission is widely used in Programmable Logic Controller (PLC), Factory Automation (FA) network communication and so on. In a practical use environment, a fine noise component is superimposed on an input waveform in some cases, and for suppression of the malfunction of the output signal due to the noise component, hysteresis for shifting a comparator threshold value according to the input/output level is generally introduced in the design of a comparator threshold voltage. However, the occurrence of a difference in comparator threshold value of pulse signal rising and falling affects the pulse width distortion and transmission delay time, and a problem remains in the viewpoint of reducing the power consumption because of the limitation of the comparator threshold value.

DETAILED DESCRIPTION

Figure 1:
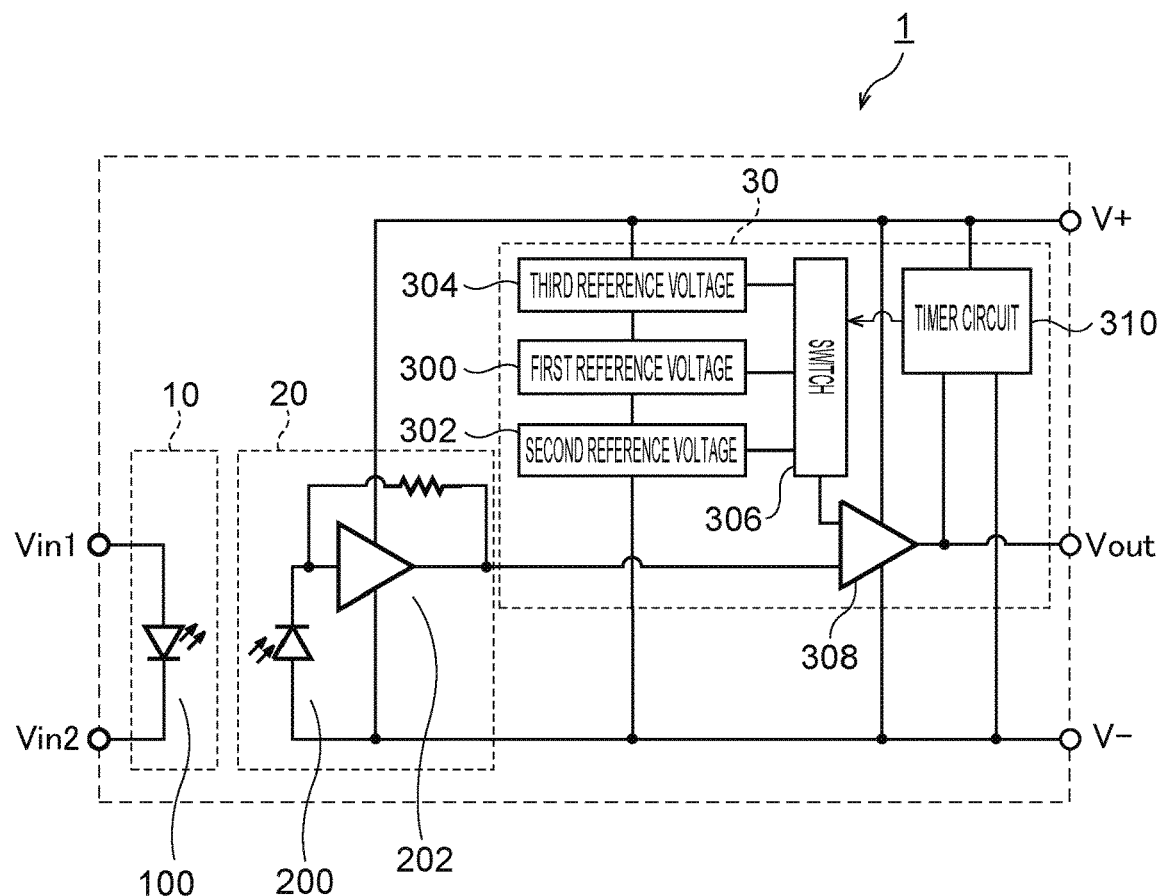
FIG. 1 illustrates a function of a semiconductor device according to an embodiment.

According to one embodiment, a semiconductor device includes a transmission circuitry, a reception circuitry, a comparison circuitry, a timer circuitry, and a switch circuitry. The transmission circuitry converts a first signal based on an input signal into a second signal and transmits the second signal. The reception circuitry is electrically insulated from the transmission circuitry, receives the second signal, and outputs a third signal. The comparison circuitry compares a reference voltage and a comparison object signal being one of the input signal and the third signal, and outputs a fourth signal. The timer circuitry outputs, when the fourth signal shifts, a fifth signal based on timing of the shift. The switch circuitry switches and outputs the reference voltage, based on the fifth signal.

Embodiments will now be explained with reference to the accompanying drawings. The present invention is not limited to the embodiments.

Hereinafter, the embodiments will be explained referring to the drawings. In the explanation, "larger than" and "smaller than" indicating the magnitude of the value may be replaced by "equal to or larger than" and "equal to or smaller than" in a range of keeping the consistency, and vice versa. Illustrated elements are exemplified as examples, and may be omitted when especially mentioned. For example, each resistor is clearly illustrated, but a resistor composed of a conductive wire or the like may be used.

FIG. 1 is a block diagram illustrating a function of a semiconductor device according to an embodiment. A semiconductor device 1 includes a transmission circuitry 10, a reception circuitry 20, and a voltage control circuitry 30, and includes, as input/output terminals, input terminals Vin1, Vin2, power supply voltage terminals V+, V−, and an output terminal Vout. The semiconductor device 1 functions, for example, as a photocoupler. The semiconductor device 1 is not limited to the photocoupler but may be a device which transmits a signal via an insulation portion by another coupling method such as a capacitive coupling or magnetic coupling. The semiconductor device 1 outputs a signal of High or Low from the output terminal Vout, for example, based on the potential difference or the current inputted from the input terminals Vin1, Vin2.

To the power supply voltage terminals V+, V−, power supply voltages $V^+$, $V^-$ being reference voltages are applied respectively. For example, $V^+$ is, but limited to, 5 V and $V^-$ is, but limited to, 0 V (ground voltage). For example, $V^+$ may be 3.3 V. The power supply voltages $V^+$, $V^-$ may be decided depending on the usage or function of the semiconductor device 1. In the following explanation, the power supply voltage terminals V+, V− are appropriately connected with a circuitry, an element or the like to be required, and apply the power supply voltages to the circuitry or terminal connected thereto.

The transmission circuitry 10 is connected with the input terminals Vin1, Vin2. The transmission circuitry 10 includes a transmission element 100. The transmission element 100 is, for example, a Light Emitting Diode (LED). The transmission circuitry 10 outputs a second signal being a transmission signal from the transmission element 100 using a first signal for driving the transmission element 100 being an input signal applied to the input terminal. For example, when voltage is applied between the input terminals as the applied signal, current is generated by an appropriate resistor (may be a resistor by a conductive wire) and converted into the first signal for causing the light emitting diode being the transmission element 100 to emit light. Then, by the first signal, the second signal being an optical signal from the light emitting diode is outputted from the transmission element 100.

The reception circuitry 20 includes a reception element 200. The reception element 200 is, for example, a Photo Diode (PD). The reception circuitry 20 is electrically insulated from the transmission circuitry 10, in particular, the transmission element 100. The reception circuitry 20 receives the second signal transmitted from the transmission circuitry 10, converts the second signal into voltage, and outputs a third signal. For example, when the transmission element 100 is a light emitting diode, the reception element 200 is a photodiode. When the reception element 200 is the photodiode, the reception circuitry 20 further includes a current-voltage converter 202 and converts the current outputted by the photodiode receiving light, into voltage. The converted voltage is outputted as the third signal. The current-voltage converter 202 includes, for example, an amplifier and a resistor.

The transmission circuitry 10 is provided on an input side of the semiconductor device 1, and the reception circuitry 20 is provided on an output side. The transmission signal transmitted from the transmission circuitry 10 is received by the reception circuitry 20 which is not electrically connected with the transmission circuitry 10, and outputted as an output signal.

The voltage control circuitry 30 is connected with the reception circuitry 20. The voltage control circuitry 30 controls the voltage to be outputted. For example, when the third signal received by the reception circuitry 20 is converted into a signal of High or Low using a fixed threshold value in the case where noise is superimposed on the input signal, the signal of High or Low possibly continuously changes in a short time due to the noise at timing when the signal exceeds the threshold value. The voltage control circuitry 30 is a circuitry which suppresses the influence of the noise before and after the timing of exceeding the threshold value, for example, at the timing of crossing the threshold value in a state where a signal at a low level shifts to a signal at a high level, and outputs a controlled voltage as the output signal.

The voltage control circuitry 30 includes a first reference voltage output circuitry 300, a second reference voltage output circuitry 302, a third reference voltage output circuitry 304, a switch circuitry 306, a comparison circuitry 308, and a timer circuitry 310.

The first reference voltage output circuitry 300, the second reference voltage output circuitry 302, and the third reference voltage output circuitry 304 output a first reference voltage, a second reference voltage, and a third reference voltage, respectively, which are reference voltages to be compared with a signal being a comparison object in the comparison circuitry 308.

These reference voltage output circuitries may use a general voltage source. For example, the reference voltage output circuitries may be the one which converts a potential difference applied between the power supply voltage terminals V+ and V−, for example, by a MOSFET (Metal-Oxide-Semiconductor Field-Effect-Transistor) and outputs the converted potential difference. The reference voltage output circuitries are not limited to the above, but may use another element. As another example, the semiconductor device 1 may have a form including a first reference voltage input terminal, a second reference voltage input terminal, and a third reference voltage input terminal which correspond to the reference voltages respectively, for receiving input of the respective reference voltages from the external part. As still another example, the semiconductor device 1 may include a first reference voltage input terminal and generate the second reference voltage and the third reference voltage in the semiconductor device 1.

The first reference voltage is a threshold value to the voltage outputted from the reception circuitry 20. When the voltage outputted from the reception circuitry 20 is higher than the first reference voltage, the semiconductor device 1 outputs a voltage of High, and when it is lower than the first reference voltage, the semiconductor device 1 outputs a voltage of Low. High and Low are indicated as examples, and the voltages may be vice versa. The semiconductor device 1 may output predetermined voltages for respective cases. For example, the voltage outputted from the reception circuitry 20 takes a value of 0 V to 3.3 V, the first reference voltage may be 1.8 V. The first reference voltage is not limited to the above, but only needs to be the voltage which can be outputted while appropriately discriminating the state for the voltage outputted from the reception circuitry 20.

The second reference voltage is a voltage lower than the first reference voltage. The third reference voltage, on the other hand, is a voltage higher than the first reference voltage. For example, when the first reference voltage is 1.8 V and the voltage of the noise to the voltage outputted from the reception circuitry 20 is about 0.1 V, the second reference voltage may be 1.0 V which is a value lower than 1.8 V−0.1 V. In this case, the third reference voltage may be 2.5 V which is a value higher than 1.8 V+0.1 V. These numerical values are indicated as examples as in the above, and the reference voltages are not limited to those values.

The switch circuitry 306 is connected with the first reference voltage output circuitry 300, the second reference voltage output circuitry 302, the third reference voltage output circuitry 304, and the timer circuitry 310. The switch circuitry 306 is a circuitry which selects and outputs one of the first reference voltage, the second reference voltage, and the third reference voltage. The switch circuitry is composed including, for example, a mechanical relay, a diode, an FET, an analog switch and so on, and exclusively switches the connection with the above three voltage output circuitries. The switch circuitry 306 exclusively switches the voltage output circuitry to be connected to thereby select the reference voltage to be inputted into the comparison circuitry 308.

The comparison circuitry 308 is connected with the reception circuitry 20 and the switch circuitry 306. The comparison circuitry 308 compares the voltage switched by the switch circuitry 306 and the third signal being the comparison object signal, and outputs a fourth signal. The fourth signal is a signal having a predetermined voltage representing High or Low as explained above. The comparison circuitry 308 is connected with the output terminal Vout and outputs the fourth signal from the semiconductor device 1.

The timer circuitry 310 is connected with the comparison circuitry 308. When the fourth signal outputted from the comparison circuitry 308 shifts between High and Low, the timer circuitry 310 outputs a fifth signal, based on the timing of the shift and on timing a predetermined time after the timing of the shift. The fifth signal is outputted to the switch circuitry 306, and the switch circuitry 306 performs switching so that the comparison circuitry 308 connects with one of the reference voltage output circuitries, based on the fifth signal.

The semiconductor device 1 transmits the first signal based on the input signal inputted from the input terminals Vin1, Vin2, to the second signal in the transmission circuitry 10 as explained above. The reception element 200 of the reception circuitry 20 electrically insulated from the transmission element 100 of the transmission circuitry 10 receives the second signal, converts the second signal into the third signal, and outputs the third signal to the comparison circuitry 308. The comparison circuitry 308 compares the reference voltage and the third signal being the comparison object signal, and outputs the fourth signal being the comparison result from the output terminal Vout. In parallel with the above, the fourth signal is inputted into the timer circuitry 310. The timer circuitry 310 outputs the fifth signal to the switch circuitry 306 on the basis of the shift state of the fourth signal. The switch circuitry 306 switches the reference voltage of the comparison circuitry 308 on the basis of the fifth signal.

Figure 2:
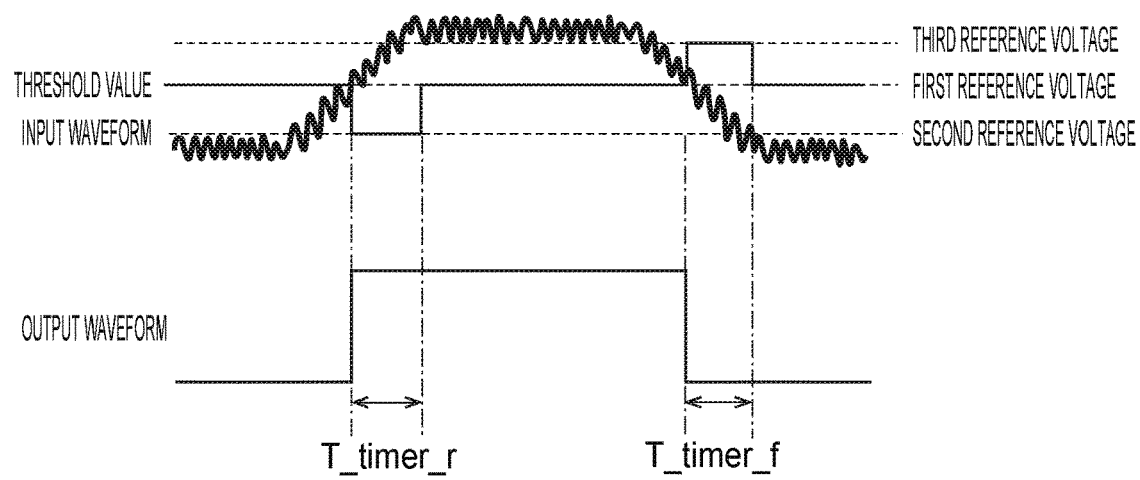
FIG. 2 schematically illustrates an output signal according to an embodiment.

The switching of the reference voltage will be explained in detail. FIG. 2 is a chart schematically illustrating an example of the switching of the reference voltage.

The semiconductor device 1 operates, for example, as a semiconductor relay using optical coupling. The first reference voltage functions as a threshold value of the switch when no noise is superimposed on the input signal. When only the first reference voltage is used as the threshold value in the case where noise is superimposed on the input signal, the waveform of the output signal oscillates between the values of High and Low under the influence of the noise at timing before or after the input signal crosses the threshold value. It is ideal that even when the noise is superimposed, the fourth signal becomes High when the input signal shifts from the state of being lower than the threshold voltage to the state of being higher than the threshold voltage, and the fourth signal becomes Low when the input signal shifts from the state of being higher than the threshold voltage to the state of being lower than the threshold voltage.

Hence, the threshold voltage is lowered to the second reference voltage being the voltage lower than the first reference voltage at timing when the comparison object signal inputted into the comparison circuitry 308 shifts from the state of being lower than the first reference voltage to the state of being higher than the first reference voltage, namely, timing when the fourth signal outputted from the comparator shifts from Low to High.

To realize the above, the timer circuitry 310 outputs the fifth signal to the switch circuitry 306 at a first timing when the fourth signal shifts from Low to High. The switch circuitry 306 receiving the fifth signal switches the circuitry connected with the comparison circuitry 308 from the first reference voltage output circuitry 300 to the second reference voltage output circuitry 302. At a second timing when a first predetermined time T_timer_r has elapsed from the first timing, the timer circuitry 310 outputs again the fifth signal to the switch circuitry 306. The switch circuitry 306 receiving the fifth signal switches the circuitry connected with the comparison circuitry 308 from the second reference voltage output circuitry 302 to the first reference voltage output circuitry 300. The above switching can keep the fourth signal to be outputted at High irrespective of the noise during rising of the signal.

On the other hand, the timer circuitry 310 outputs the fifth signal to the switch circuitry 306 at a third timing when the fourth signal shifts from High to Low. The switch circuitry 306 receiving the fifth signal switches the circuitry connected with the comparison circuitry 308 from the first reference voltage output circuitry 300 to the third reference voltage output circuitry 304. At a fourth timing when a second predetermined time T_timer_f has elapsed from the third timing, the timer circuitry 310 outputs again the fifth signal to the switch circuitry 306. The switch circuitry 306 receiving the fifth signal switches the circuitry connected with the comparison circuitry 308 from the third reference voltage output circuitry 304 to the first reference voltage output circuitry 300. The above switching can keep the fourth signal to be outputted at Low irrespective of the noise during fall of the signal.

As explained above, by the operations of the timer circuitry 310 and the switch circuitry 306, the fourth signal becomes High when the input signal shifts from the state of being lower than the first reference voltage being the threshold voltage to the state of being higher than the first reference voltage and becomes Low when the input signal shifts from the state of being higher than the first reference voltage to the state of being lower than the first reference voltage.

There are various kinds of conceivable implementation for the fifth signal and the operation of the switch circuitry 306.

As first implementation, the timer circuitry 310 may output equivalent pulses at respective timings, namely, at timings of the above first timing to fourth timing. The switch circuitry 306 holds a preceding state and switches the reference voltage output circuitry based on the held state. For example, in the initial state, the switch circuitry 306 is connected with the first reference voltage output circuitry 300, and switches the reference voltage output circuitry to the second reference voltage output circuitry 302 upon receipt of the fifth signal. The switch circuitry 306 holds a state of having switched from the first reference voltage output circuitry 300 to the second reference voltage output circuitry 302, and switches the reference voltage output circuitry to the first reference voltage output circuitry 300 upon next receipt of the fifth signal. The switch circuitry 306 holds a state of having switched from the second reference voltage output circuitry 302 to the first reference voltage output circuitry 300, and switches the reference voltage output circuitry to the second reference voltage output circuitry 302 upon next receipt of the fifth signal. As explained above, by holding the immediately-preceding switching state, the timer circuitry 310 controls the fourth signal by emitting a pulse as the fifth signal without especially performing processing on the fifth signal.

As second implementation, the timer circuitry 310 may output a pulse representing how to switch the switch at respective timings. The timer circuitry 310 may output to the switch circuitry 306, as the fifth signal, in a discriminating manner, a signal for instructing to switch from the first reference voltage output circuitry 300 to the second reference voltage output circuitry 302 at a first timing, a signal for instructing to switch from the second reference voltage output circuitry 302 to the first reference voltage output circuitry 300 at a second timing, a signal for instructing to switch from the first reference voltage output circuitry 300 to the third reference voltage output circuitry 304 at a third timing, and a signal for instructing to switch from the third reference voltage output circuitry 304 to the first reference voltage output circuitry 300 at a fourth timing. The switch circuitry 306 receiving the fifth signal switches the output circuitry on the basis of the fifth signal. The timer circuitry 310 may emit, for example, a pulse having a different voltage, current or the like as the pulse of the fifth signal. As explained above, the timer circuitry 310 outputs, to the switch circuitry 306, the fifth signal with a signal for enabling identification of which of the shifts it is added thereto, and the switch circuitry 306 may switch the switch based on the received fifth signal. As a matter of course, the timer circuitry 310 may generate and transmit, not limited to the pulse but, an identification signal by other implementation such as modulation in real time or the like.

As third implementation, the timer circuitry 310 outputs the pulse signal, namely, the signal operating as a trigger in the above but may output a signal operating as a toggle. For example, the fifth signal becoming High is outputted for the first predetermined time T_timer_r from the first timing. The output of the fifth signal becoming High is finished at the second timing. Similarly, the fifth signal becoming High is outputted for the second predetermined time T_timer_f from the third timing. The output of the fifth signal becoming High is finished at the fourth timing. During the receipt of the fifth signal being High, the switch circuitry 306 switches from the first reference voltage output circuitry 300 to the second reference voltage output circuitry 302 or the third reference voltage output circuitry 304 on the basis of the held immediately-preceding state. As explained above, the timer circuitry 310 may output the fifth signal operating as a toggle.

As fourth implementation, the timer circuitry 310 may make the toggle signal in the third implementation a signal having a voltage, current or the like different in rising and falling of the fourth signal. The switch circuitry 306 switches the voltage output circuitry on the basis of the inputted fifth signal. As explained above, the timer circuitry 310 may output a fifth signal operating as a toggle and representing in which of the states it is. As in the second implementation, the timer circuitry 310 may generate not a voltage value or a current value but a signal for identifying timing by different modification or the like.

In any case, the switch circuitry 306 selects and outputs the second reference voltage until the first predetermined time after the comparison object signal shifts from the state of being lower than the first reference voltage to the state of higher than the first reference voltage, and selects and outputs the third reference voltage until the second predetermined time after the comparison object signal shifts from the state of being higher than the first reference voltage to the state of being lower than the first reference voltage. In other cases, the switch circuitry 306 selects and outputs the first reference voltage.

In order to perform the above operation, the timer circuitry 310 includes, for example, a delay circuitry in which inverter circuitries are sequentially connected, and may output the fifth signal at the first timing corresponding to the output of the comparison circuitry 308, and output again the fifth signal after the first predetermined time T_timer_r by passing through the delay circuitry. The same applies to the second predetermined time T_timer_f. In the case where the fifth signal is outputted as the toggle, for example, outputs of a circuitry not delaying and the delay circuitry may be synthesized by an exclusive logical sum circuitry.

As another example, the timer circuitry 310 may be the one which measures the predetermined time using a time constant of the capacitor. In this case, the timer circuitry 310 may be the one which includes an inductor and a resistor and measures the predetermined time by the time constant by the capacitor, inductor, and resistor.

As still another example, a terminal for inputting the predetermined time may be provided in the semiconductor device 1 so that the user can control the first predetermined time and the second predetermined time. These implementations are described as examples, and the implementation is not limited to these implementations as long as the operations of the timer circuitry 310 and the switch circuitry 306 are appropriately performed.

The first predetermined time and the second predetermined time may be the same time or may be different times. Further, these predetermined times may be set for each usage of the semiconductor device 1 so that the predetermined time becomes, for example, a value sufficiently smaller than a value conceivable as a cycle or the like of the input signal applied to the input terminals Vin1, Vin2, for example, a value of 1/100 to 1/10 or the like.

As explained above, according to this embodiment, the semiconductor device 1 can appropriately control the output by changing the reference voltage during the predetermined time using a timer even in the case where the noise is superimposed on the input signal. Use of the timer makes it possible to change the threshold voltage during the time when the noise greatly affects, and to expand the range of selection of the threshold voltage. The transmission element 100 is, for example, a light emitting diode, and the reception element 200 is, for example, a photodiode. In this case, the semiconductor device 1 operates as a photocoupler high in noise resistance to the input signal. Further, the implementation of setting the second reference voltage to the ground voltage can be simplified, and thereby can achieve the lowered voltage and lowered current of the first reference voltage and the corresponding input signal, thereby promoting the reduction in power consumption.

Figure 3:
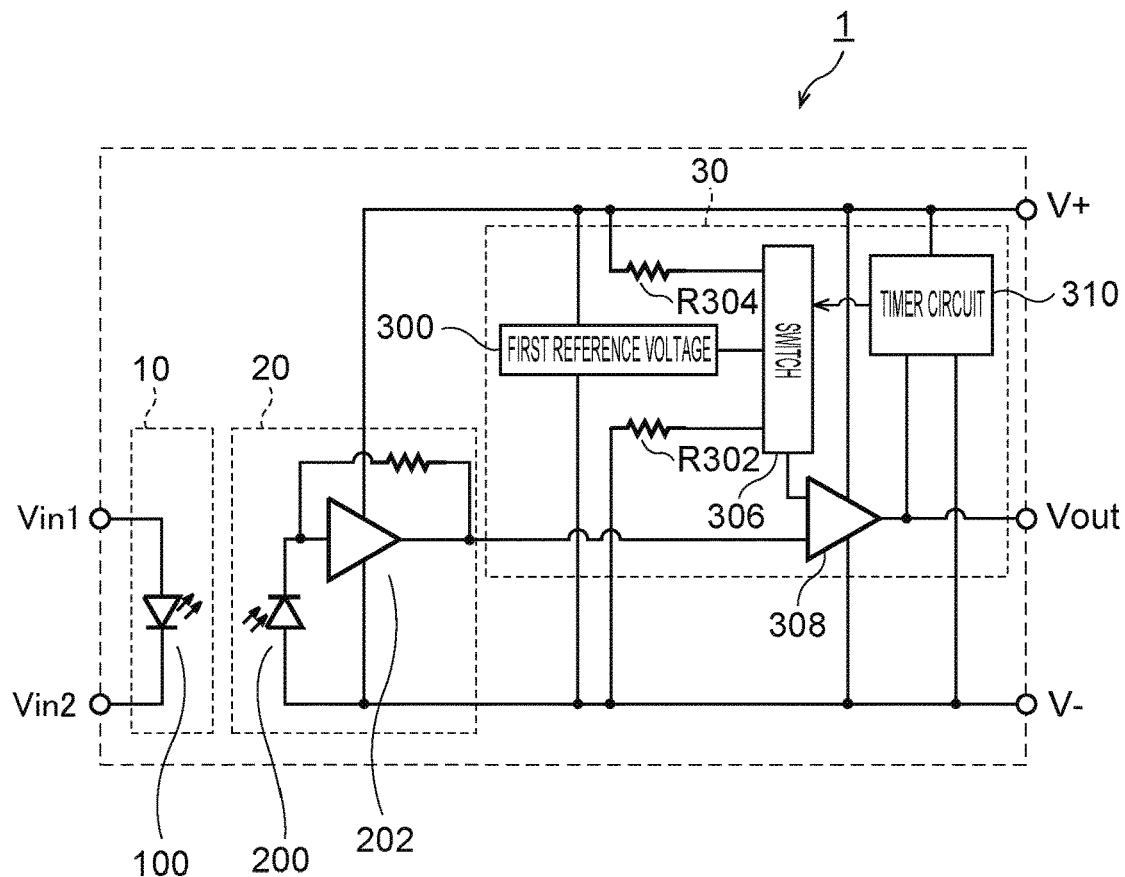
FIG. 3 illustrates another example of the semiconductor device according to an embodiment.

FIG. 3 is a block diagram illustrating a semiconductor device 1 according to a modified example of the reference voltage output circuitry. The semiconductor device 1 includes a pulldown resistor R302 as the second reference voltage output circuitry 302, and a pullup resistor R304 as the third reference voltage output circuitry 304.

As explained above, the second reference voltage may be outputted by pupping down the power supply voltage $V^-$, and the third reference voltage may be outputted by pulling up the power supply voltages $V^+$.

Figure 4:
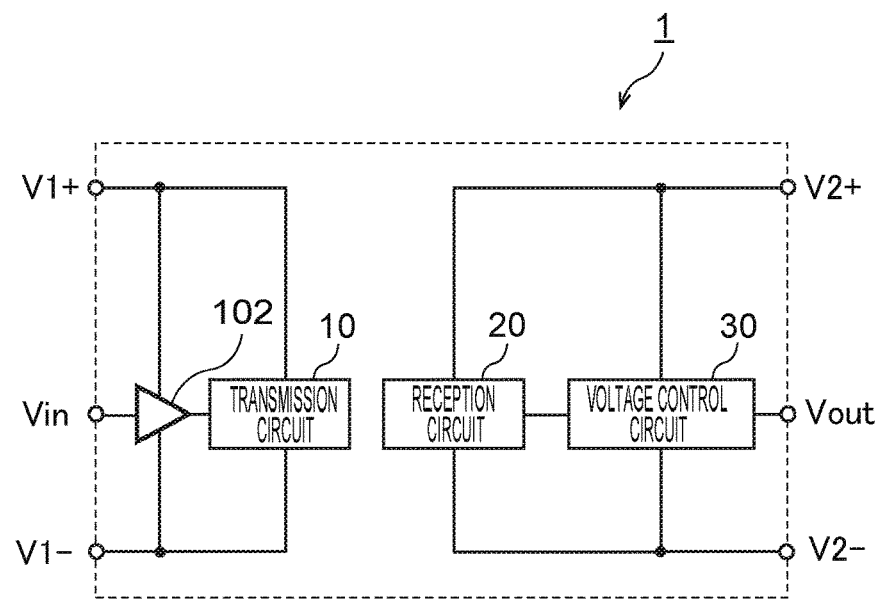
FIG. 4 illustrates another example of the semiconductor device according to an embodiment.

FIG. 4 is a diagram illustrating another form of the semiconductor device 1. As illustrated in this drawing, the semiconductor device 1 may further include power supply voltage terminals V1+, V1− on the input side. In this case, to discriminate them from power supply voltage terminals on the output side, the power supply voltage terminals on the output side are described as V2+, V2− as illustrated in the drawing.

For example, the power supply voltage is required in some cases when applying the input signal to the transmission element 100 of the transmission circuitry 10. In this case, taking the configuration in FIG. 4 enables a buffer 102 (or amplifier or the like) to appropriately convert the power supply voltage and the input signal and to input them into the transmission circuitry 10. Note that in the case where the LED and the like can be directly driven in optical coupling type insulation signal transmission as explained above, the buffer 102 can be omitted as a matter of course.

Figure 5:
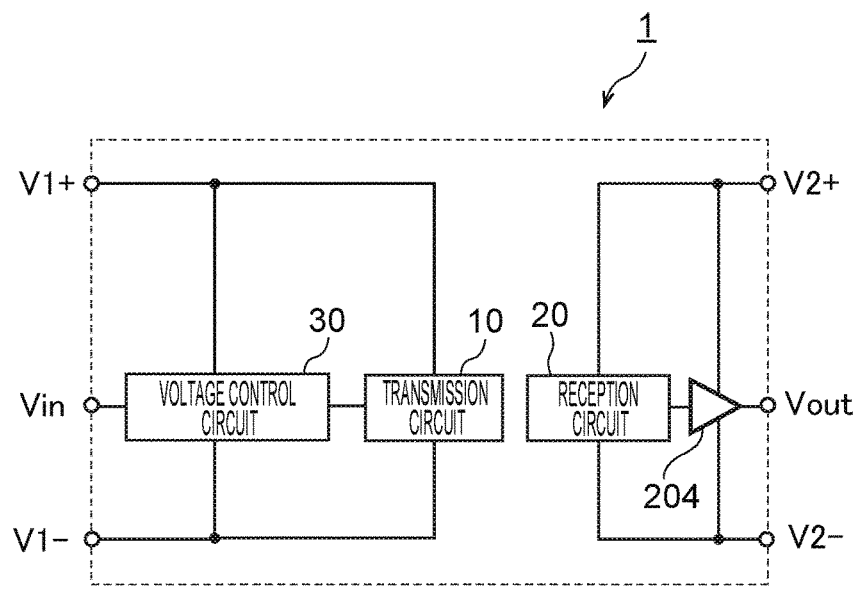
FIG. 5 illustrates another example of the semiconductor device according to an embodiment.

FIG. 5 is a block diagram illustrating a semiconductor device 1 according to a modified example of the voltage control circuitry 30. The semiconductor device 1 may use the output of the voltage control circuitry 30 as the input to the transmission circuitry 10. Connecting the voltage control circuitry 30 to the stage preceding to the transmission circuitry 10 as illustrated enables transmission and reception of the signal from which the noise superimposed on the input signal has been removed, between the transmission circuitry 10 and the reception circuitry 20. The voltage control circuitry 30 is connected with the power supply voltage terminals V1+, V1− on the input side.

In this case, the connection relation of the switch circuitry 306 does not especially change, but the connection relation of the comparison circuitry 308 changes. The comparison circuitry 308 is connected, on the input side, with the input terminal, and connected, on the output side, with the transmission circuitry 10 and the timer circuitry 310.

More specifically, the comparison circuitry 308 compares the input signal being the comparison object signal and the reference voltage, and outputs the fourth signal based on the input signal to the transmission circuitry 10 as the first signal. In the transmission circuitry 10, the fourth signal is converted into the second signal. The reception circuitry 20 receives the second signal and outputs the third signal as the output signal.

Also in the semiconductor device 1 according to the form as in FIG. 5, the same function as that in the above embodiment can be offered. For example, the transmission element 100 and the reception element 200 are elements which form capacitive coupling elements or magnetic coupling elements. Further, even in the case of the photocoupler, the voltage control circuitry 30 may be provided at the stage preceding to the transmission circuitry 10.

The voltage control circuitry 30 is provided not only for the input terminal Vin as illustrated in FIG. 5, but the voltage control circuitry 30 may be provided to be across both the input terminals Vin1, Vin2 as in FIG. 1. In this case, for example, a differential amplifier circuitry may be further provided before the input of the not-illustrated comparison circuitry 308.

Further, the signal received through insulation signal transmission by the reception circuitry 20 may be subjected to amplification or the like by the power supply voltage on the output side. A buffer 204 (or an amplifier or the like) connected with the power supply voltage terminals V2+, V2− is provided between the reception circuitry 20 and the output terminal Vout as illustrated in FIG. 5 and is thereby implemented. As a matter of course, the buffer 204 may be omitted depending on the circuitry design.

As explained above, the voltage control circuitry 30 can be provided on the input side.

Figure 6:
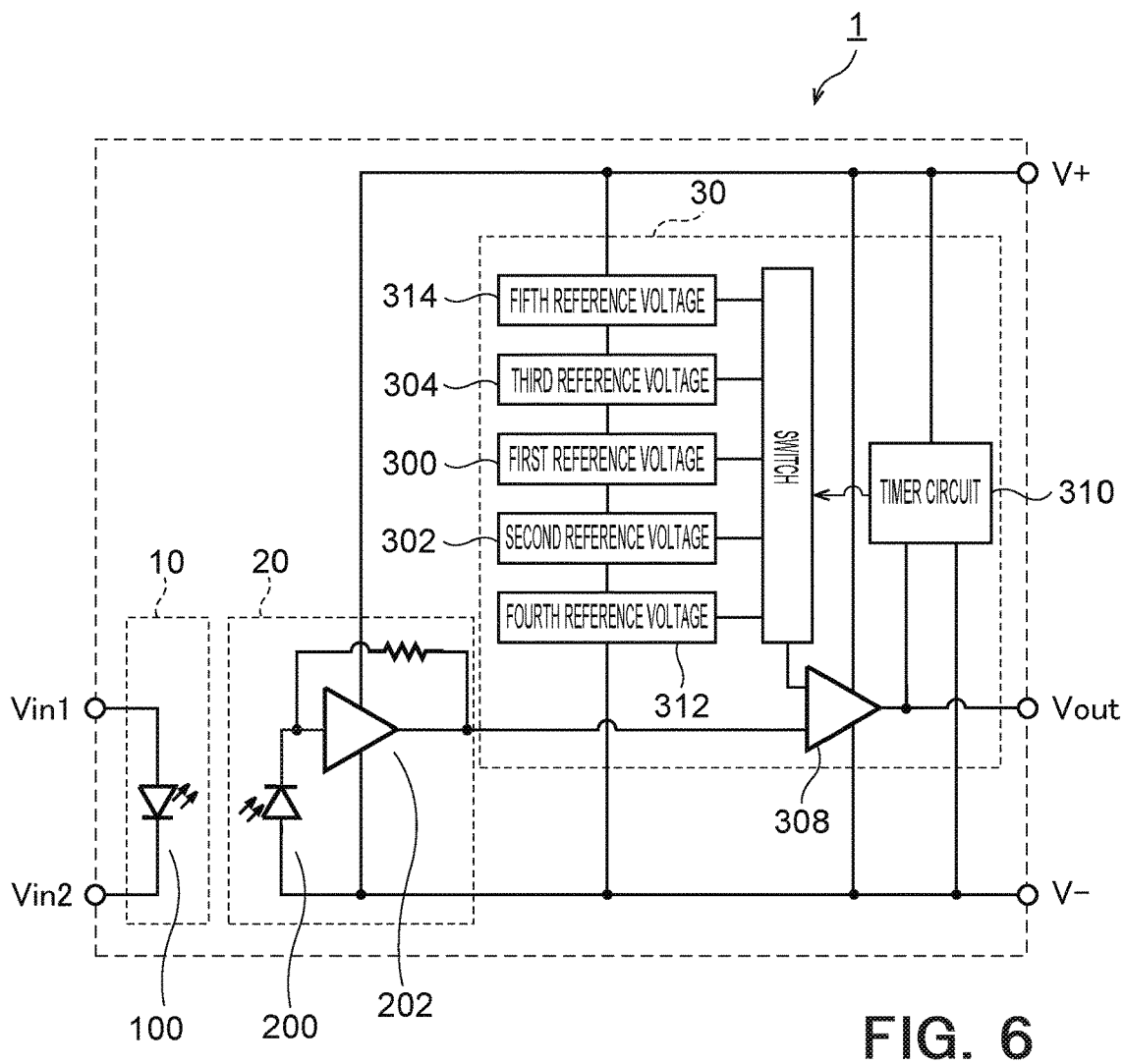
FIG. 6 illustrates another example of the semiconductor device according to the embodiment.

The number of reference voltages in the above embodiments and modified examples is three but not limited to this. For example, five reference voltage sources may be provided as illustrated in FIG. 6. For example, a fourth reference voltage output circuitry 312 outputs a fourth reference voltage lower than the second reference voltage, and a fifth reference voltage output circuitry 314 outputs a fifth reference voltage higher than the third reference voltage.

The timer circuitry 310 measures, in addition to the first predetermined time and the second predetermined time, a third predetermined time shorter than the first predetermined time and a fourth predetermined time shorter than the second predetermined time, and outputs the fifth signal according to the above explanation.

The switch circuitry 306 switches to the fourth reference voltage output circuitry 312 at a rising timing, switches to the second reference voltage output circuitry 302 after a lapse of the third predetermined time from the rising timing, and switches to the first reference voltage output circuitry 300 after a lapse of the first predetermined time from the rising timing. Each timing is determined by receipt of the fifth signal as explained in the above.

Similarly, the switch circuitry 306 switches to the fifth reference voltage output circuitry 314 at a falling timing, switches to the third reference voltage output circuitry 304 after a lapse of the fourth predetermined time from the falling timing, and switches to the first reference voltage output circuitry 300 after a lapse of the second predetermined time from the falling timing.

Figure 7:
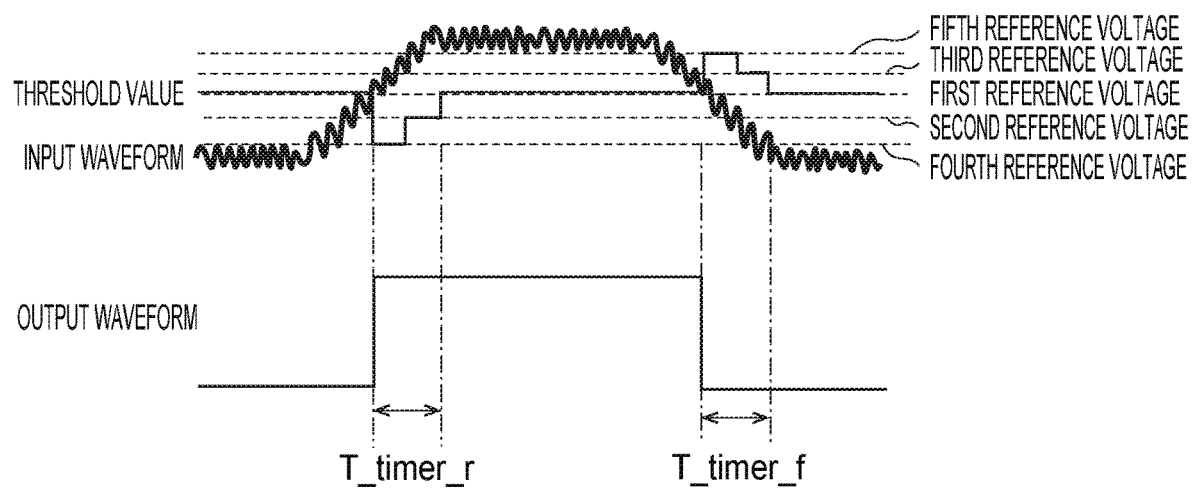
FIG. 7 schematically illustrates another example of the output signal according to an embodiment.

FIG. 7 is a chart illustrating the relationship among the input waveform, the threshold value, and the output waveform in this case. The threshold value greatly varies at each of the rising timing and the falling timing, but returns to the first reference voltage stepwise thereafter. The output waveform with respect to the input waveform is equivalent to that illustrated in FIG. 2. On the other hand, it becomes possible to more finely control the threshold voltage to the extent of being not affected by the noise.

As explained above, not the reference voltages at three levels but reference voltages at more finely divided levels may be used. To further reduce the power consumption, it is adoptable that the second reference voltage is the ground voltage, the fourth reference voltage output circuitry 312 is not provided, and the first reference voltage and the corresponding input signal may be lowered in voltage. Further, not the reference voltages at five levels but reference voltages at more finely divided levels may be set.

Still another modified example of the voltage control circuitry 30 will be explained. In the following modified example, a current source and a resistor are provided between the power supply voltage terminals V+ and V− to generate respective reference voltages.

Figure 8:
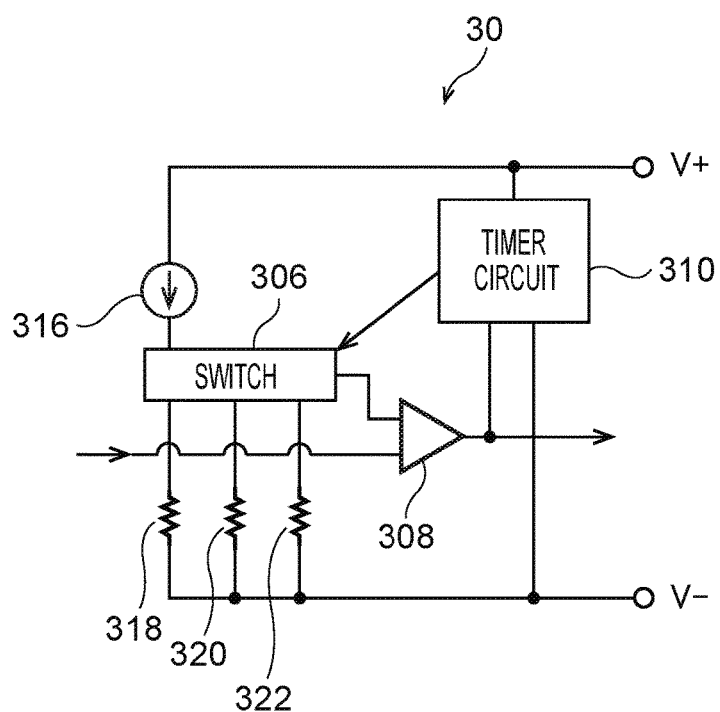
FIG. 8 illustrates another example of the semiconductor device according to an embodiment.

FIG. 8 is a diagram illustrating a modified example of the voltage control circuitry 30. The voltage control circuitry 30 includes a constant current source 316 and resistors 318, 320, 322. The combination of the constant current source 316 and each of the resistors is exclusively switched by the switch circuitry 306. The resistors are set so that, for example, their resistance values satisfy the relation of the resistor 318<the resistor 320<the resistor 322. The switch circuitry 306 connects the constant current source 316 and the resistor 320 which generates a voltage corresponding to the first reference voltage in a steady state.

When the output signal from the comparison circuitry 308 is in a rising state and the switch circuitry 306 receives a signal representing rising or a signal at timing of rising from the timer circuitry 310, the switch circuitry 306 switches the connection from the resistor 320 to the resistor 318. Thus, the constant current source 316 is connected with the resistor 318 which generates a voltage corresponding to the second reference voltage, thereby lowering the threshold voltage of the comparison circuitry 308. After the first predetermined time measured by the timer circuitry 310, the switch circuitry 306 switches the connection to the resistor 320.

Similarly, when the signal represents falling, the switch circuitry 306 switches the connection to the resistor 322 which generates a voltage corresponding to the third reference voltage, thereby increasing the threshold value of the comparison circuitry 308 to the third reference voltage. After the second predetermined time, the switch circuitry 306 switches the connection to the resistor 320.

Note that the positions of the constant current source 316 and the resistors 318, 320, 322 are not limited to the above, but the constant current source 316 may be positioned between the switch circuitry 306 and the power supply voltage terminal V−, and the resistors 318, 320, 322 may be positioned between the switch circuitry 306 and the power supply voltage terminal V+. In other words, they may be in an arbitrary arrangement in which the switch circuitry 306 can switch from the first reference voltage to the third reference voltage.

Figure 9:
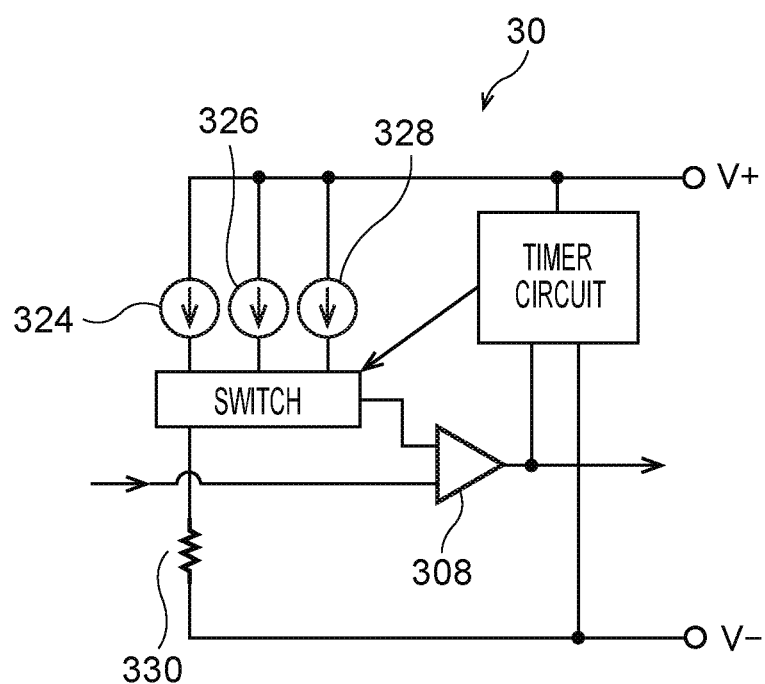
FIG. 9 illustrates another example of the semiconductor device according to an embodiment.

FIG. 9 is a diagram illustrating still another modified example of the voltage control circuitry 30. The voltage control circuitry 30 includes constant current sources 324, 326, 328 and a resistor 330. The combination of the resistor 330 and each of the constant current sources is exclusively switched by the switch circuitry 306. The constant current sources are set so that, for example, their current values satisfy the relation of the constant current source 324<the constant current source 326<the constant current source 328. The switch circuitry 306 connects the constant current source 326 which outputs a current for generating a voltage corresponding to the first reference voltage and the resistor 330 in a steady state.

When the output signal from the comparison circuitry 308 is in a rising state and the switch circuitry 306 receives a signal representing rising or a signal at timing of rising from the timer circuitry 310, the switch circuitry 306 switches the connection from the constant current source 326 to the constant current source 324. Thus, the constant current source 324 which outputs a current for generating a voltage corresponding to the second reference voltage and the resistor 330 are connected, thereby lowering the threshold voltage of the comparison circuitry 308. After the first predetermined time measured by the timer circuitry 310, the switch circuitry 306 switches the connection to the constant current source 326.

Similarly, when the signal represents falling, the switch circuitry 306 switches the connection to the constant current source 328 which outputs a current for generating a voltage corresponding to the third reference voltage, thereby increasing the threshold value of the comparison circuitry 308 to the third reference voltage. After the second predetermined time, the switch circuitry 306 switches the connection to the constant current source 326.

As in the case of FIG. 8, the positional relation among the constant current sources, the resistor 330, the power supply voltage terminals V+, V−, the switch circuitry 306 can be in an arbitrary arrangement in which the first reference voltage can be switched to the third reference voltage.

Also in the above case, the reference voltages do not have to be three kinds but reference voltages of more kinds may be switched. Besides, in FIG. 8, FIG. 9, the power supply voltage terminals V+, V− represent the power supply voltage terminals V1+, V1− or the power supply voltage terminals V2+, V2− depending on the position where the voltage control circuitry 30 is provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a transmission circuitry which converts a first signal based on an input signal into a second signal and transmits the second signal;
a reception circuitry which is electrically insulated from the transmission circuitry, receives the second signal, and outputs a third signal;
a comparison circuitry which compares a reference voltage and a comparison object signal being one of the input signal and the third signal, and outputs a fourth signal which shifts when the comparison object signal shifts to a state of being higher than a first voltage from a state of being lower than the first voltage or when the comparison object signal shifts to a state of being lower than the first voltage from a state of being higher than the first voltage;
a timer circuitry which outputs a fifth signal based on the fourth signal; and
a switch circuitry which switches and outputs the reference voltage being one of the first voltage, a second voltage, and a third voltage, based on the fifth signal, the second voltage being lower than the first voltage, the third voltage being higher than the first voltage,
wherein the timer circuitry outputs the fifth signal:
at a first time when the comparison object signal shifts from a state of being lower than the first voltage to a state of being higher than the first voltage;
at a second time after a first predetermined time from the first time;
at a third time when the comparison object signal shifts from a state of being higher than the first voltage to a state of being lower than the first voltage; and
at a fourth time after a second predetermined time from the third time.

2. The semiconductor device according to claim 1, wherein the switch circuitry selects and outputs, based on the fifth signal:
the reference voltage being the second voltage until the first predetermined time after the comparison object signal shifts from the state of being lower than the first voltage to the state of being higher than the first voltage; and
the reference voltage being the third voltage until the second predetermined time after the comparison object signal shifts from the state of being higher than the first voltage to the state of being lower than the first voltage.

3. The semiconductor device according to claim 1, wherein:
an output of the reception circuitry and an output of the switch circuitry are connected with inputs of the comparison circuitry;
an output of the comparison circuitry is connected with an output terminal and an input of the timer circuitry;
an output of the timer circuitry is connected with an input of the switch circuitry; and
the comparison object signal is the third signal.

4. The semiconductor device according to claim 1, wherein:
an output of the comparison circuitry is connected with an input of the transmission circuitry and an input of the timer circuitry;
an output of the timer circuitry is connected with an input of the switch circuitry;
an output of the switch circuitry are connected with an input of the comparison circuitry;
the comparison object signal is the input signal; and
the fourth signal is the first signal.

5. The semiconductor device according to claim 1, wherein the transmission circuitry and the reception circuitry include at least one of a photocoupler, a capacitive coupling element, and a magnetic coupling element.

6. A semiconductor device comprising:
a transmission circuitry which converts a first signal based on an input signal into a second signal and transmits the second signal;
a reception circuitry which is electrically insulated from the transmission circuitry, receives the second signal, and outputs a third signal;
a comparison circuitry which compares a reference voltage and a comparison object signal being one of the input signal and the third signal, and outputs a fourth signal which shifts when the comparison object signal shifts to a state of being higher than a first voltage from a state of being lower than the first voltage or when the comparison object signal shifts to a state of being lower than the first voltage from a state of being higher than the first voltage;

a timer circuitry which outputs a fifth signal based on the fourth signal; and a switch circuitry which switches and outputs the reference voltage being one of the first voltage, a second voltage, and a third voltage, based on the fifth signal, the second voltage being lower than the first voltage, the third voltage being higher than the first voltage, wherein the timer circuitry continuously outputs the fifth signal:

for a period from a first time when the comparison object signal shifts from the state of being lower than the first voltage to the state of being higher than the first voltage to a second time after a first predetermined time from the first time; and for a period from a third time when the comparison object signal shifts from the state of being higher than the first voltage to the state of being lower than the first voltage to a fourth time after a second predetermined time from the third time.

7. The semiconductor device according to claim 6, wherein the switch circuitry selects and outputs, based on the fifth signal:

the reference voltage being the second voltage until the first predetermined time after the comparison object signal shifts from the state of being lower than the first voltage to the state of being higher than the first voltage; and the reference voltage being the third voltage until the second predetermined time after the comparison object signal shifts from the state of being higher than the first voltage to the state of being lower than the first voltage.

8. The semiconductor device according to claim 6, wherein:

an output of the reception circuitry and an output of the switch circuitry are connected with inputs of the comparison circuitry;

an output of the comparison circuitry is connected with an output terminal and an input of the timer circuitry;

an output of the timer circuitry is connected with an input of the switch circuitry; and the comparison object signal is the third signal.

9. The semiconductor device according to claim 6, wherein:

an output of the comparison circuitry is connected with an input of the transmission circuitry and an input of the timer circuitry;

an output of the timer circuitry is connected with an input of the switch circuitry;

an input terminal and an output of the switch circuitry are connected with an input of the comparison circuitry;

the comparison object signal is the input signal; and the fourth signal is the first signal.

10. The semiconductor device according to claim 6, wherein the transmission circuitry and the reception circuitry include at least one of a photocoupler, a capacitive coupling element, and a magnetic coupling element.

\* \* \* \* \*